US008735301B2

(12) United States Patent  
Chen

(10) Patent No.: US 8,735,301 B2  
(45) Date of Patent: May 27, 2014

(54) METHOD FOR MANUFACTURING SEMICONDUCTOR INTEGRATED CIRCUIT

(75) Inventor: Chun-Lung Chen, Tainan (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 206 days.

(21) Appl. No.: 13/114,053

(22) Filed: May 24, 2011

(65) Prior Publication Data

US 2012/0302068 A1 Nov. 29, 2012

(51) Int. Cl.
*H01L 21/033* (2006.01)
*H01L 21/768* (2006.01)

(52) U.S. Cl.
USPC ........... 438/754; 438/637; 438/798; 438/945; 438/952

(58) Field of Classification Search
USPC .......................... 438/754, 798, 945, 952, 637
See application file for complete search history.

(56) References Cited

U.S. PATENT DOCUMENTS

| 6,140,225 | A | * | 10/2000 | Usami et al. | 438/637 |
| 7,452,660 | B1 | | 11/2008 | Huang et al. | |
| 2003/0228755 | A1 | * | 12/2003 | Esry et al. | 438/669 |
| 2004/0192034 | A1 | * | 9/2004 | Ohiwa et al. | 438/637 |
| 2005/0239286 | A1 | * | 10/2005 | Wu et al. | 438/637 |
| 2006/0199393 | A1 | * | 9/2006 | Lee et al. | 438/710 |
| 2006/0252256 | A1 | * | 11/2006 | Weng et al. | 438/637 |
| 2006/0286793 | A1 | * | 12/2006 | Lin et al. | 438/637 |
| 2010/0032642 | A1 | * | 2/2010 | Park et al. | 257/4 |
| 2012/0270389 | A1 | * | 10/2012 | Lin et al. | 438/627 |

FOREIGN PATENT DOCUMENTS

CN 102820254 A * 12/2012 ........... H01L 21/768

* cited by examiner

Primary Examiner — Zandra Smith
Assistant Examiner — Toniae Thomas
(74) Attorney, Agent, or Firm — Winston Hsu; Scott Margo

(57) ABSTRACT

A method for manufacturing a semiconductor integrated circuit includes providing a substrate having at least a metal hard mask formed thereon. Subsequently a patterning step is performed to the metal hard mask to form a patterned metal hard mask and followed by performing a $H_2O$ plasma treatment to the patterned metal hard mask.

15 Claims, 3 Drawing Sheets

METHOD FOR MANUFACTURING SEMICONDUCTOR INTEGRATED CIRCUIT

BACKGROUND OF THE INVENTION

1. Field of the Invention

The present invention relates generally to a method for manufacturing a semiconductor integrated circuit, more particularly, to a method adopting metal hard mask for manufacturing a semiconductor integrated circuit.

2. Description of the Prior Art

In the fabrication of semiconductor integrated circuits (ICs), semiconductor devices are generally connected by several metallic interconnecting layers commonly referred to as multi-level interconnects, and damascene process has been deemed a convenient and predominant method for forming the multi-level interconnects. Principally, the damascene process includes etching a dielectric material layer to form trench and/or via patterns, filling the patterns with conductive materials such as copper, and performing a planarization process. Thus a metal interconnect is obtained. According to the patterns located in the dielectric layer, the damascene process is categorized into trench-first process, via-first process, partial-via-first process, and self-aligned process.

The conventional method for manufacturing a dual damascene structure first provides a substrate having a conductive layer formed therein. Then, a multilayered dielectric structure and a metal hard mask are sequentially formed on the substrate. The metal hard mask is subsequently patterned to form an opening and followed by performing an etching process to etch the multilayered dielectric structure to form a trench pattern or via pattern for the dual damascene structure. It is noteworthy that during forming the opening or during the etching process, contaminations such as fall-on particles are always formed. The fall-on particles are attracted to the metal hard mask by the Van der Waals force between itself and the metal hard mask. Consequently, the fall-on particles adhere to the metal hard mask or are attracted to around the metal hard mask. Therefore, the conventional cleaning process cannot remove the fall-on particles and the fall-on particles may significantly obstruct the following performed etching process. Consequently, the obtained trench opening is shrunk or made incomplete due to the fall-on particles. Such defects further arises line broken issue because the metal used to fill the incomplete trench opening inherits the incompleteness, and thus the reliability of the metal interconnection is adversely impacted.

SUMMARY OF THE INVENTION

According to an aspect of the present invention, there is provided a method for manufacturing a semiconductor integrated circuit. The manufacturing method includes providing a substrate having at least a metal hard mask formed thereon, performing a patterning step to pattern the metal hard mask to form a patterned metal hard mask, and performing a $H_2O$ plasma treatment to the patterned metal hard mask.

According to the method for manufacturing a semiconductor integrated circuit, the $H_2O$ plasma treatment is performed to remove the charges from the patterned metal hard mask after the patterning step. Therefore the fall-on particles are no longer attracted to adhere the patterned metal hard mask due to the Van der Waals force. Accordingly, the fall-on particles are easily removed by the following cleaning step. Furthermore, the etching process performed afterwards will not be adversely impacted and thus the etching result is improved. Consequently, line broken issue caused by the fall-on particles are eliminated, and thus reliability of the semiconductor IC is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
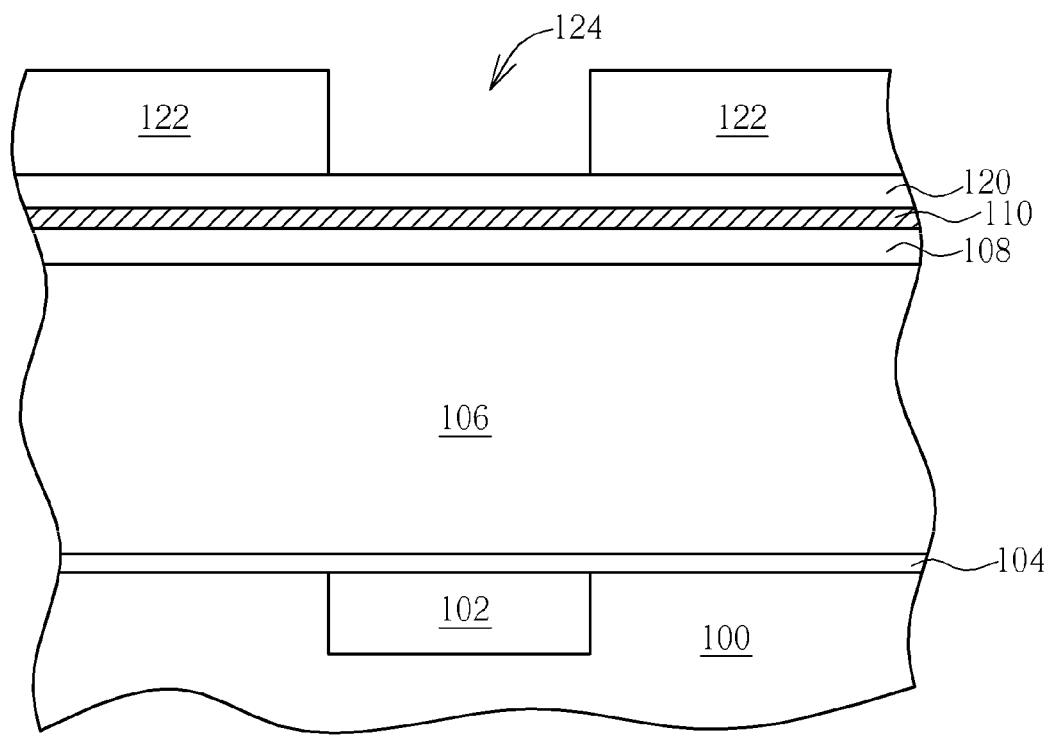
FIGS. 1-6 are schematic drawings illustrating a method for manufacturing a semiconductor integrated circuit provided by a preferred embodiment of the present invention.

Please refer to FIGS. 1-6, which are schematic drawings illustrating a method for manufacturing a semiconductor integrated circuit provided by a preferred embodiment of the present invention. As shown in FIG. 1, the preferred embodiment first provides a substrate 100, such as a silicon substrate, silicon-containing substrate, or silicon-on-insulator (SOI) substrate. The substrate 100 includes a conductive layer 102 and a base layer 104 covering the conductive layer 102. In the preferred embodiment, the conductive layer 102 includes metal material and the base layer 104 includes nitrogen-doped silicon carbide. Furthermore, the substrate 100 includes a dielectric layer 106 covering the base layer 104 as shown in FIG. 1. The dielectric layer 106 can include low dielectric constant (K) (i.e. K value lower than 3.9) material, ultra low-k (ULK) (i.e. K value lower than 2.6) material, or porous ULK material. It is well-known that the low-K material, the ULK material and the porous ULK material are not dense materials and has weak structure strength, therefore, a dense cap layer 108 is exemplarily formed on the dielectric layer 106 in the preferred embodiment. The cap layer 108 can be a single-layered structure including silicon oxide (SiO), silicon oxynitride (SiON) or tetraethylorthosilicate (TEOS) as shown in FIG. 1. The cap layer 108 also can be a multi-layered structure.

Please still refer to FIG. 1. Next, a metal hard mask 110 covering the cap layer 108 is formed on the substrate 100. The metal hard mask 110 can be a single-layered structure or a multi-layered structured. The metal hard mask 110 includes materials selected from the group consisting of titanium (Ti), titanium nitride (TiN), tantalum (Ta), and tantalum nitride (TaN). For example, the metal hard mask 110 provided by the preferred embodiment can be a multi-layered structure including Ti/TiN or Ta/TaN, but not limited to this. It is noteworthy that because a stress of the metal hard mask 110 is usually opposite to a stress of the dielectric layer 106, the cap layer 108 provided by the preferred embodiment further serves as a buffer between the metal hard mask 110 and the dielectric layer 106. Therefore the dielectric layer 106 is protected from being directly impacted by the opposite stress from the metal hard mask 110. As shown in FIG. 1, an anti-reflective coating (ARC) layer 120 is formed on the metal hard mask 110 according to the preferred embodiment. The ARC 120 can include SiON or TEOS, but not limited to this.

In a modification to the preferred embodiment, the conductive layer 102 can include other conductive material such as metal nitride, silicide, or doped silicon, and the cap layer 108 can include silicon nitride (SiN), SiO, or SiON. According to the modification, the metal hard mask 110 is directly formed on the cap layer 108.

Please still refer to FIG. 1. Next, a patterned photoresist 122 is formed on the ARC 120. The patterned photoresist 122 includes at least an opening 124 for defining a trench pattern of a damascene structure.

Figure 2:
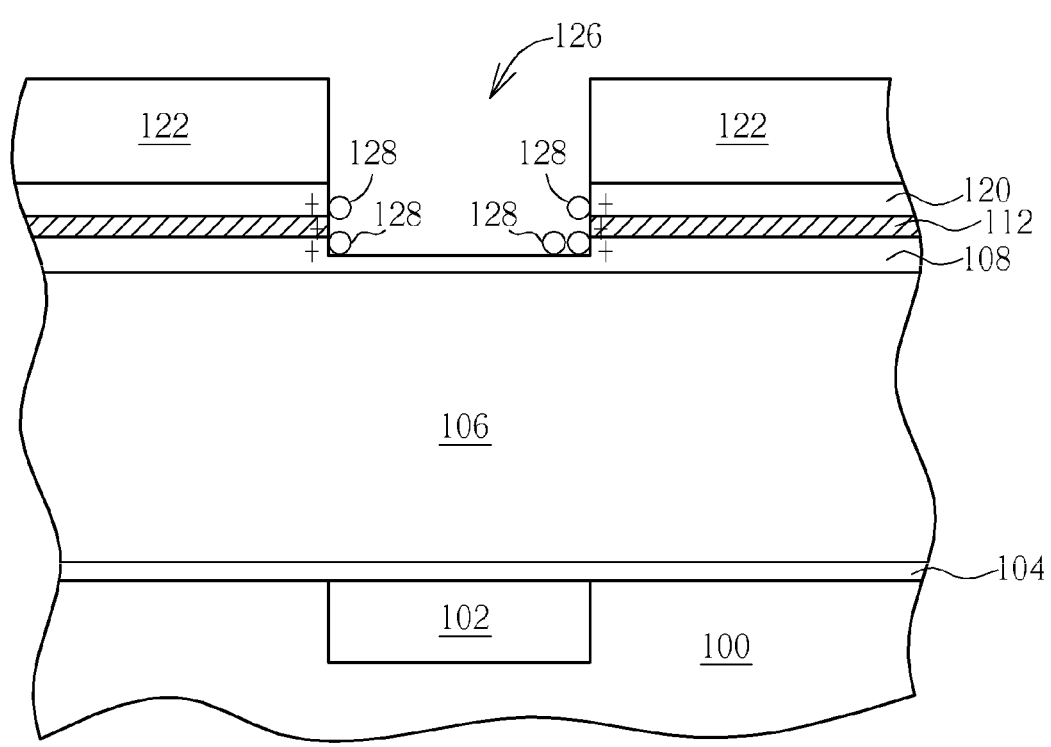

Please refer to FIG. 2. After forming the patterned photoresist 122, a patterning step is performed to the metal hard mask 110. Accordingly, the patterning step etches the ARC 120, the metal hard mask 110, and a portion of the cap layer 108 through the opening 124 of the patterned photoresist 122. Therefore a patterned metal hard mask 112 having at least an opening 126 is obtained. It is noteworthy that the patterned metal hard mask 112 always has charges, such as positive charges, after the patterning step. Therefore fall-on particles 128 generated in the patterning step are attracted to adhere or around the opening 126 of the patterned metal hard mask 112 by the Van der Waals force.

Figure 3:
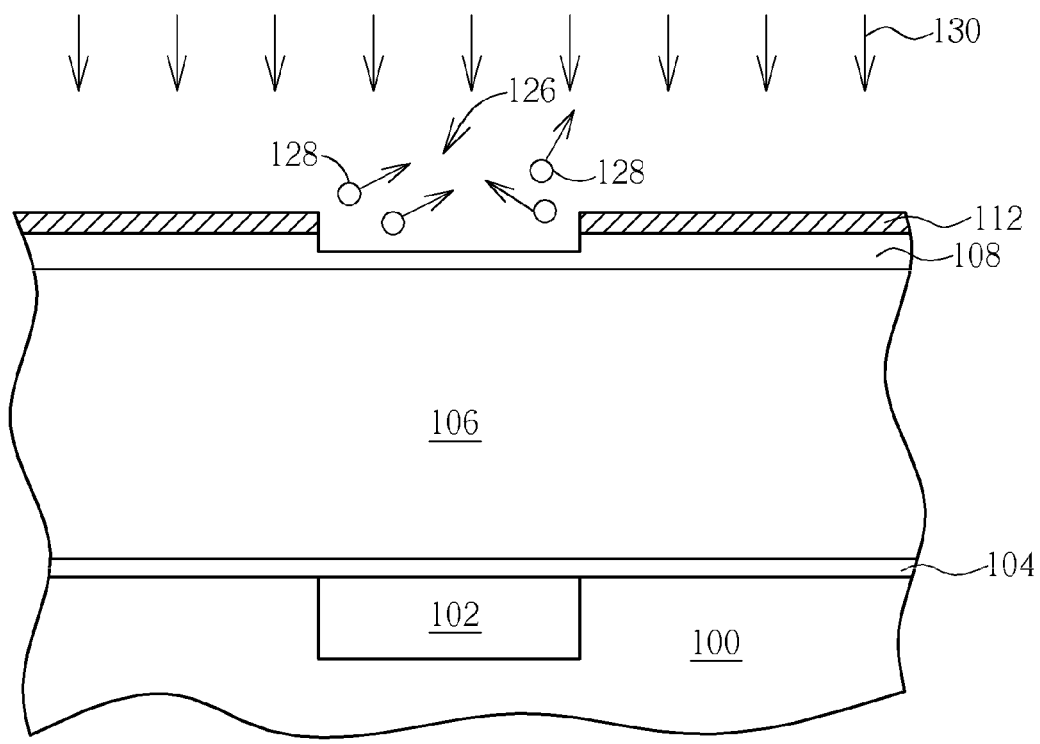

Please refer to FIG. 3. After forming the patterned metal hard mask 112, a $H_2O$ plasma treatment 130 is performed to in-situ remove the patterned photoresist 122, the ARC 120, and the positive charges from the patterned metal hard mask 112. According to the preferred embodiment, a $H_2O$ vapor is introduced first. A gas flow rate of the $H_2O$ vapor is between 2000 standard cubic centimeter per minute (sccm) and 3000 sccm. Then the $H_2O$ vapor is transformed into a reactive $H_2O$ plasma which allows reacting with photoresist material, and thus the patterned photoresist 122, the ARC 120, and the positive charges are removed by the $H_2O$ plasma. According to the preferred embodiment, the $H_2O$ plasma treatment 130 is performed between 15 seconds and 60 seconds, at a process pressure between 3000 mTorr and 9000 mTorr, and at a process temperature between 20° C. and 350° C. Because the $H_2O$ plasma treatment 130 removes the positive charges from the patterned metal hard mask 112, the fall-on particles 128 are no longer attracted to the opening 126 of the patterned metal hard mask 112 by the Van der Waals force. Consequently, the fall-on particles 128 are easily removed by the conventional cleaning step. Furthermore, during the $H_2O$ plasma treatment 130 and the following cleaning step, the dielectric layer 106 is still protected by the dense cap layer 108.

In addition, an oxygen ($O_2$) plasma treatment (not shown) can be performed before the $H_2O$ plasma treatment 130 in the preferred embodiment. The $O_2$ plasma treatment is performed to improve the removal of the patterned photoresist 122 and the ARC 120. Furthermore, to improve the removal of the positive charges from the patterned metal hard mask 112, the $H_2O$ plasma treatment 130 provided by the preferred embodiment can include negative charges. Additionally, if the patterned metal hard mask 112 carries negative charges, the $H_2O$ plasma treatment 130 provided by the preferred embodiment can include positive charge for improving the removal of the negative charges.

Figure 4:
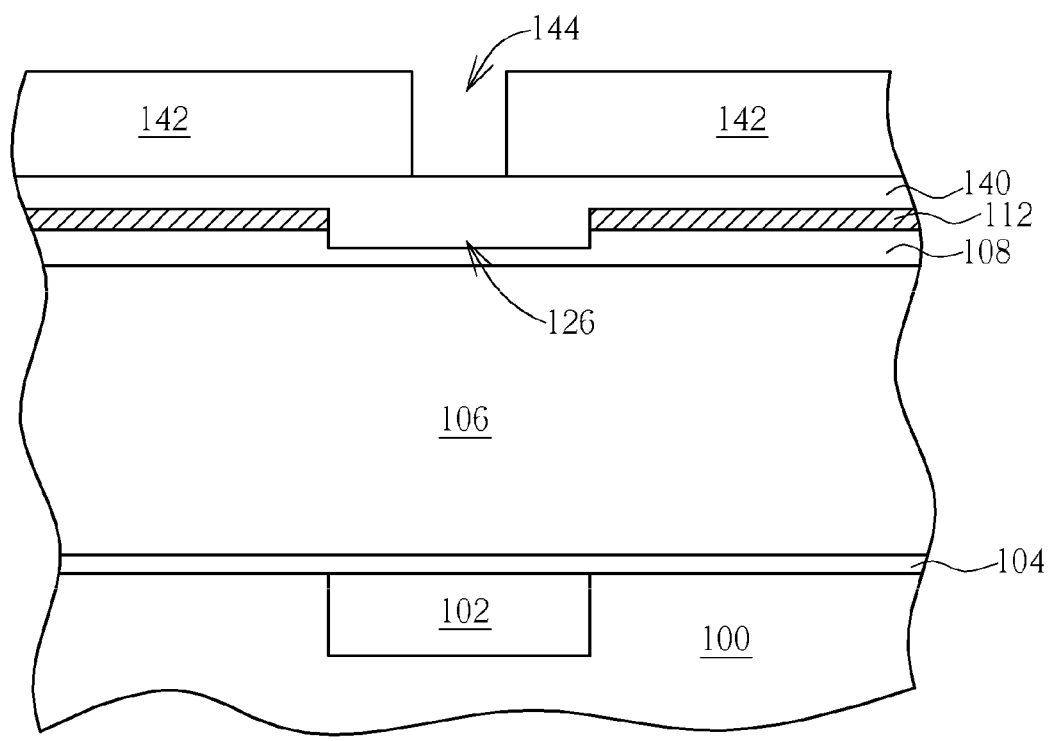

Please refer to FIG. 4. After the $H_2O$ plasma treatment 130, a cleaning step (not shown) as mentioned above is performed to remove the fall-on particles 128. Then, an ARC 140 and a patterned photoresist 142 are sequentially formed on the patterned metal hard mask 112. As shown in FIG. 4, the ARC 140 fills the opening 126, and the patterned photoresist 142 includes an opening 126 corresponding to the opening 144. The opening 144 is situated directly above the opening 126 and is used to define a via pattern of a damascene structure.

Figure 5:
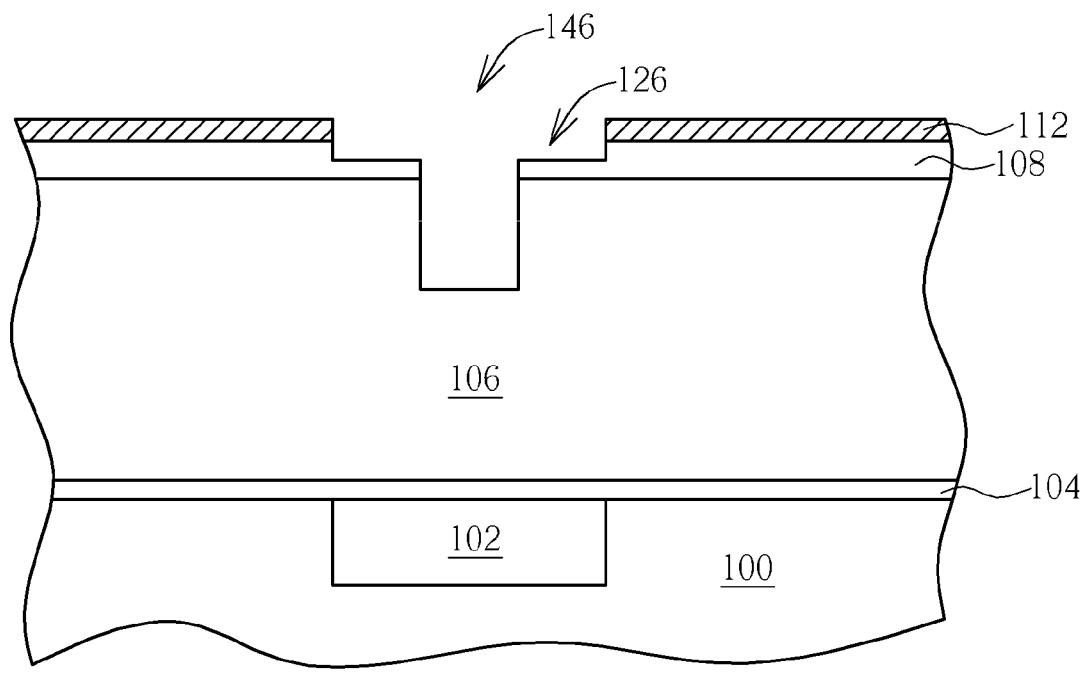

Please refer to FIG. 5. Next, the ARC 140, the cap layer 108, and a portion of the dielectric layer 106 are etched through the opening 144 of the patterned photoresist 142 with the patterned photoresist 142 serving as an etching mask. Consequently, an opening 146 is formed in an upper portion of the dielectric layer 106. The opening 146 corresponding to the opening 126 serves as a partial via. After forming the opening 146, the patterned photoresist 142 and the ARC 140 are removed by performing an $O_2$ plasma treatment.

Figure 6:
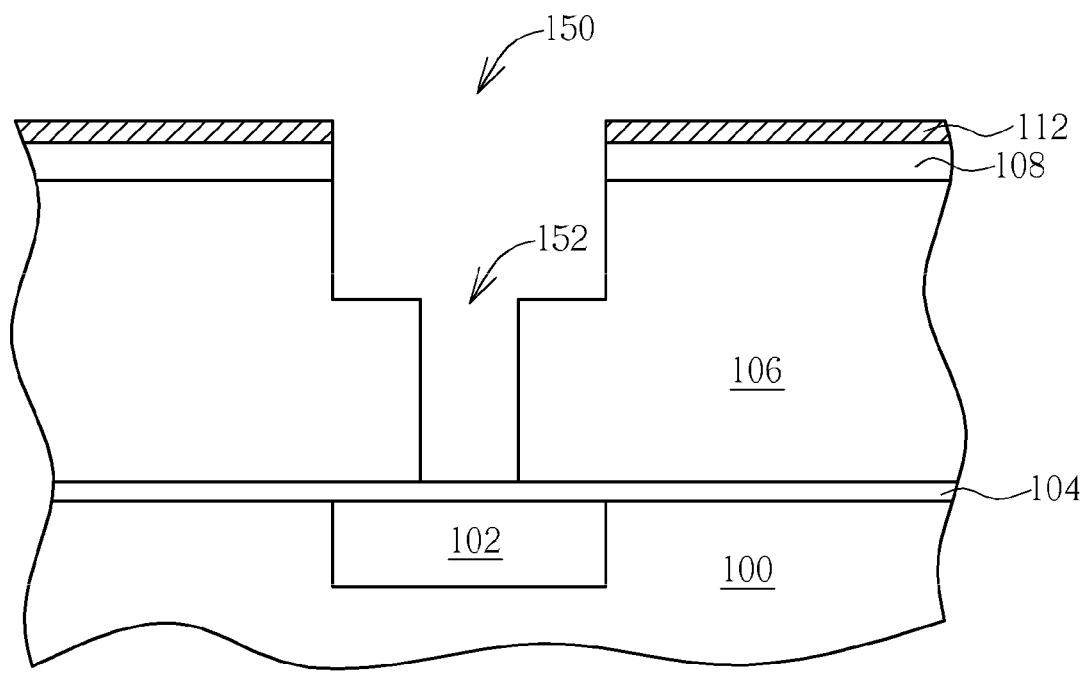

Please refer to FIG. 6. Next, an etching process is performed to etch the cap layer 108 not covered by the patterned metal hard mask 112 and the dielectric layer 106 with the patterned metal hard mask 112 serving as an etching mask. Consequently, the opening 126 and the opening 146 are transferred into the dielectric layer 106 to form a trench opening 150 and a via opening 152 in the dielectric layer 106. As shown in FIG. 6, the base layer 104 is exposed in a bottom of the via opening 152.

After forming the trench opening 150 and the via opening 152, adequate etching process is performed to remove the base layer 104 from the bottom of via opening 152, thus the conductive layer 102 is exposed. Then, a barrier layer (not shown) and a conductive layer (not shown) filling up the trench opening 150 and the via opening 152 are sequentially formed in the trench opening 150 and the via opening 152 and followed by performing a planarization to remove the unnecessary conductive layer. Thus, a dual damascene structure is obtained. Since those steps are well-known to those skilled in the art, the details are omitted from the preferred embodiment in the interest of brevity. It is noteworthy that since the fall-on particles 128 are no longer attracted by the Van der Waals force, the fall-on particles 128 are easily removed by the cleaning process. Accordingly, the opening 126 and the opening 146 are entirely and completely transferred into the dielectric layer 106 to form the trench opening 150 and the via opening 152. Therefore, the conductive layer filling the complete trench opening 150 and via opening 152 inherits the completeness, and the line broken issue is effectively eliminated.

According to the method for manufacturing a semiconductor integrated circuit, the $H_2O$ plasma treatment is performed to remove the charges from the patterned metal hard mask after the patterning step. Therefore the fall-on particles are no longer attracted to adhere the patterned metal hard mask due to the Van der Waals force. Accordingly, the fall-on particles are easily removed by the following cleaning step. Furthermore, the etching process performed afterwards will not be adversely impacted and thus the etching result is improved. Consequently, line broken issue caused by the fall-on particles are eliminated and thus reliability of the semiconductor IC is improved.

Those skilled in the art will readily observe that numerous modifications and alterations of the device and method may be made while retaining the teachings of the invention.

What is claimed is:

1. A method for manufacturing a semiconductor integrated circuit comprising:

providing a substrate having at least a conductive layer, a base layer covering the conductive layer, a dielectric layer covering the base layer, a cap layer, and a metal hard mask formed thereon;

performing a patterning step to pattern the metal hard mask to form a patterned metal hard mask; and performing a $H_2O$ plasma treatment to the patterned metal hard mask.

2. The method for manufacturing a semiconductor integrated circuit according to claim 1, wherein the metal hard mask comprises materials selected from the group consisting of titanium (Ti), titanium nitride (TiN), tantalum (Ta), and tantalum nitride (TaN).

3. The method for manufacturing a semiconductor integrated circuit according to claim 1, wherein the patterned metal hard mask comprises charges and the $H_2O$ plasma treatment is performed to remove the charges from the patterned metal hard mask.

4. The method for manufacturing a semiconductor integrated circuit according to claim 3, wherein the patterned metal hard mask comprises positive charges.

5. The method for manufacturing a semiconductor integrated circuit according to claim 4, wherein the $H_2O$ plasma treatment comprises negative charges.

6. The method for manufacturing a semiconductor integrated circuit according to claim 3, further comprising forming a first patterned photoresist on the metal hard mask for patterning the metal hard mask.

7. The method for manufacturing a semiconductor integrated circuit according to claim 6, wherein the $H_2O$ plasma treatment is performed to in-situ removes the charges and the first patterned photoresist.

8. The method for manufacturing a semiconductor integrated circuit according to claim 6, further comprising forming a first anti-reflective coating between the first patterned photoresist and the metal hard mask.

9. The method for manufacturing a semiconductor integrated circuit according to claim 1, further comprising performing an oxygen ($O_2$) plasma treatment before the $H_2O$ plasma treatment.

10. The method for manufacturing a semiconductor integrated circuit according to claim 1, wherein the $H_2O$ plasma treatment is performed between 15 seconds and 60 seconds.

11. The method for manufacturing a semiconductor integrated circuit according to claim 1, wherein the $H_2O$ plasma treatment comprising introducing a $H_2O$ vapor, and a gas flow rate of the $H_2O$ vapor is between 2000 standard cubic centimeter per minute (sccm) and 3000 sccm.

12. The method for manufacturing a semiconductor integrated circuit according to claim 1, wherein the $H_2O$ plasma treatment is performed at a process pressure between 3000 mTorr and 9000 mTorr.

13. The method for manufacturing a semiconductor integrated circuit according to claim 1, wherein the $H_2O$ plasma treatment is performed at a process temperature between 20° C. and 350° C.

14. The method for manufacturing a semiconductor integrated circuit according to claim 1, wherein the patterned metal hard mask comprises at least a first opening, and the cap layer is exposed in a bottom of the first opening.

15. The method for manufacturing a semiconductor integrated circuit according to claim 14, further comprising following steps performed after the $H_2O$ plasma treatment:
   forming a second anti-reflective coating and a second patterned photoresist on the patterned metal hard mask sequentially; and
   etching the second anti-reflective coating, the cap layer, and the dielectric layer through the second patterned photoresist to form at least a second opening corresponding to the first opening.

* * * * *